(12) United States Patent
Kakinuma

(10) Patent No.: US 6,894,267 B2
(45) Date of Patent: May 17, 2005

(54) PHOTODETECTOR DEVICE HAVING STACKED STRUCTURE WITH IMPROVED RESPONSE RATE

(75) Inventor: Hiroaki Kakinuma, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/984,280

(22) Filed: Oct. 29, 2001

(65) Prior Publication Data

US 2002/0050592 A1 May 2, 2002

(30) Foreign Application Priority Data

Oct. 27, 2000 (JP) .......................................... 2000-327981
Jan. 31, 2001 (JP) .......................................... 2001-024385

(51) Int. Cl.[7] .............................................. H01L 31/00
(52) U.S. Cl. .................................... 250/214.1; 257/225
(58) Field of Search ....................... 250/214.1; 257/225, 257/257, 290, 291

(56) References Cited

U.S. PATENT DOCUMENTS 4,654,468 A * 3/1987 Nath et al. .................. 136/256
4,822,992 A * 4/1989 Bar-Joseph et al. ........... 257/15
5,105,240 A * 4/1992 Omura ......................... 257/85
5,574,289 A * 11/1996 Aoki et al. .................... 257/17
6,020,620 A * 2/2000 Kusakabe .................... 257/436
6,184,538 B1 * 2/2001 Bandara et al. ................ 257/21

FOREIGN PATENT DOCUMENTS

JP          01-265225        * 10/1989

* cited by examiner

*Primary Examiner*—Thanh X. Luu
*Assistant Examiner*—Stephen Yam
(74) *Attorney, Agent, or Firm*—Volentine Francos & Whitt, PLLC

(57) ABSTRACT

A photodiode is provided which can operate at a high rate and is suitable for optical communications. The photodiode with a pin-type configuration of an end surface incidence type includes a first photodiode unit having a first n-type blocking layer, a first light-absorbing layer constituted by an intrinsic semiconductor, and a first p-type blocking layer on a semiinsulating substrate; a second photodiode unit having layers of the same configuration formed thereon; a contact layer; a first electrode; and a second electrode, wherein the thickness of each light-absorbing layer is half that in a conventional monolayer photodiode. As a result, the maximum travel time of the carriers (electrons and holes) in each photodiode unit is reduced by half and the photodiode can operate at a rate higher than that of the conventional photodiode.

11 Claims, 11 Drawing Sheets

PHOTODETECTOR DEVICE HAVING STACKED STRUCTURE WITH IMPROVED RESPONSE RATE

BACKGROUND OF THIS INVENTION

1. Field of the Invention

The present invention relates to a structure of a photodetector device mainly employed for optical communications.

2. Description of Related Art

Research and development have recently been intensely conducted to increase a modulation frequency in order to transmit a larger volume of information in optical communications using optical fibers. Accordingly, research aimed at the increase (to no less than 20 Gb/s) of operation speed of photodetector devices (for example, photodiodes) for detecting the modulated signal light has been actively conducted.

FIG. 10 shows an example of a typical conventional structure of such photodiode. Thus, the photodiode shown in the figure has a pin-type structure with a monolayer configuration of an end surface incidence type in which an incident light I0 from an end surface (side surface) is received. In this FIG. 10, the reference numeral 1 stands for a semiinsulating substrate composed of InP (indium-phosphorus) having semiinsulating properties, 3 for an n-type blocking layer composed of n$^+$-type InP for preventing the injection of positive holes from the outside, 5 for a light-absorbing layer (i-type or intrinsic semiconductor layer) composed of i-type InGaAs (indium-gallium-arsenic) for absorption of light and generation of electron-hole pairs, 7 for a p-type blocking layer composed of p$^+$-type InP for preventing the injection of electrons from the outside, and 9 for a contact layer composed of p$^{++}$-type InGaAs for the formation of ohmic contact with an electrode. Furthermore, the reference numeral 11 stands for a first electrode electrically connected to the n-type blocking layer 3 and having a configuration formed by successive lamination of a gold-germanium alloy (AuGe), nickel (Ni), and gold (Au) (that is, a AuGe/Ni/Au laminated configuration) on the end portion of the n-type blocking layer 3. The reference numeral 13 stands for a second electrode electrically connected to the contact layer 9 and having a configuration formed by successive lamination of titanium (Ti), platinum (Pt), and gold (Au) (that is, a Ti/Pt/Au laminated configuration) on the contact layer 9. The reference character 5 stands for an output signal terminal, G for a ground terminal, and V for a power source terminal.

When such photodiode is driven, a voltage of about −3~−5 V (volts) is applied to the power source terminal V and the ground terminal G is grounded. Further, d stands for a thickness of the light-absorbing layer 5. The typical thickness of photodiodes of this type is 0.4~1.0 μm. Furthermore, characters h, e, and E stand for holes, electrons, and electric field, respectively.

Electron-hole pairs are generated by a signal light I0 (wavelength λ=1.55 μm) incident onto the end surface of the light-absorbing layer 5 of the photodiode and absorbed by the light-absorbing layer 5. Under the effect of electric field E applied in the light-absorbing layer 5, electrons drift toward the n-type blocking layer 3 and the holes drift toward the p-type blocking layer 7. The holes that reached the p-type blocking layer 7, which is in the upper portion, and the electrons that reached the n-type blocking layer 3, which is in the lower portion, are led out to the outside as current from the output signal terminal S.

A structure of an upper surface incidence type in which the incident light I0 is received from the upper surface, as shown in FIG. 11, is another example of the typical conventional structure of the photodiodes of this type. The photodetector device of such structure has a photodiode unit of a pin-type with a monolayer configuration. In FIG. 11, the reference numeral 1 stands for a semiinsulating substrate composed of InP having semiinsulating properties, 3 for an n-type blocking layer composed of n$^+$-type InP for preventing the injection of positive holes from the outside, 5 for a light-absorbing layer (i-type or intrinsic semiconductor layer) composed of i-type InGaAs for absorption of light and generation of electron-hole pairs, 7 stands for a p-type blocking layer composed of p$^+$-type InP for preventing the injection of electrons from the outside, and 9 for a contact layer composed of p$^{++}$-type InGaAs for establishing an ohmic contact with an electrode.

The reference numeral 11 stands for a first electrode electrically connected to the n-type blocking layer 3 and having a configuration formed by successive lamination of a gold-germanium alloy (AuGe), nickel (Ni), and gold (Au) (that is, a AuGe/Ni/Au laminated configuration) on the end portion of the n-type blocking layer 3. The reference numeral 13 stands for a second electrode electrically connected to the contact layer 9 and having a configuration formed by successive lamination of titanium (Ti), platinum (Pt), and gold (Au) (that is, a Ti/Pt/Au laminated configuration) on the contact layer 9. The reference character S stands for an output signal terminal, G for a ground terminal, and V for a power source terminal. An opening 13$a$ is provided in the second electrode 13 in the region corresponding to the incident light photodetection region.

During driving of such photodiode, a voltage of about −3~−5 V (volts) is applied to the power source terminal V and the ground terminal G is grounded. Further, d stands for a thickness of the light-absorbing layer 5. The typical thickness of the photodiode of this type is 0.4~1.0 μm. Furthermore, characters h, e, and S stand for holes, electrons, and electric field, respectively.

The signal light I0 (wavelength λ=1.55 μm) incident onto photodiode from the upper surface is absorbed by the light-absorbing layer 5 and electron-hole pairs are thus generated. The electrons and holes drift toward the n-type blocking layer 3 and p-type blocking layer 7, respectively, by the electric field E applied in the light-absorbing layer 5. The holes that reached the upper p-type blocking layer 7 and the electrons that reached the lower n-type blocking layer 3 are led out to the outside as current from the output signal terminal S.

The pin-type photodiode of an end surface incidence type having a photodiode unit of a monolayer configuration has a response to the signal light modulated by a modulation frequency of 10~40 Gb/s. However, in order to obtain an even higher response in the diodes of this type, the thickness d of the light-absorbing layer 5 is preferably decreased to shorten the maximum travel time $\tau_{tr}$ of the carriers. However, if the thickness d is made too small, the capacity C of the photodiode is increased, the CR time constant $\tau_{CR}$ which is another factor affecting the response is increased, and the response is slowed. Furthermore, because the amount of incident light is also decreased, the sensitivity dropped. In addition, the incidence position of the signal light incident from the outside was difficult to align on the element end surface, thereby limiting the increase in response rate.

Moreover, in the above-described photodiode with a pin-type structure of an upper surface incidence type having a photodiode unit of a monolayer configuration, the surface area of the light-receiving surface had to be enlarged. Therefore, the capacitance C generated in the element was increased and the CR time constant $\tau_{CR}$, was increased. As a result, the photodiode demonstrated a response only to a signal light modulated with a modulation frequency of about 20 Gb/s.

It is an object of the present invention to resolve the above-described problems and to provide a photodiode that can response (operate) at a rate higher than that of the above-described conventional diodes.

SUMMARY OF THE INVENTION

In order to resolve the above-described object, the present invention in accordance with the first aspect thereof provides a photodetector device having a structure in which a plurality of photodetector element units are stacked. Each of the photodetector element units which is formed by successive lamination of a first blocking layer composed of a first conductivity type semiconductor, a light-absorbing layer composed of an intrinsic semiconductor, and a second blocking layer composed of a second conductivity type semiconductor on a substrate. In the photodetector element unit wherein a modulated signal light is received, absorbed by the light-absorbing layer, converted into an electric signal, and output to the outside. It is preferred that in the photodetector device, first conductivity type InP may be used as the first blocking layer, i-type In$_y$Ga1-$_y$As (where y is a positive real number, and 1>y>0) be used as the light-absorbing layer, and second conductivity type InP be used as the second blocking layer.

Furthermore, each of the photodetector element units of the above-described photodetector device of the present invention comprises a first optical waveguide layer composed of a first conductivity type semiconductor and a second optical waveguide layer composed of a second conductivity type semiconductor. The first optical waveguide layer is provided between the first blocking layer and light-absorbing layer. The band gap of the first optical waveguide layer is between those of the first blocking layer and light-absorbing layer, The second optical waveguide layer is provided between the light-absorbing layer and the second blocking layer. The band gap of the second optical waveguide layer is between those of the light-absorbing layer and second blocking layer.

In this case, it is preferred that first conductivity type InP may be used as the first blocking layer, i-type In$_y$Ga1—$_y$As (where y is a positive real number, and 1>y>0) be used as the light-absorbing layer, second conductivity type InP be used as the second blocking layer, first conductivity type InGaAsP be used as the first optical waveguide layer, and second conductivity type InGaAsP be used as the second optical waveguide layer.

The first conductivity type is any one of the n-type and p-type, and the second conductivity type is the other one of the n-type and p-type.

The above-described photodetector device of the present invention may be of an end surface incidence type in which the signal light is incident onto the end surface of each of the light-absorbing layers of photodetector element units. In this case, the thickness of each of the light-absorbing layers in the photodetector element units is substantially the same. When two of the photodetector element units are stacked in the photodetector device of the end surface incidence type, the thickness of each light-absorbing layer is preferably 0.2~0.5 μm.

Furthermore, the photodetector device of the present invention can be of an upper surface incidence type in which the signal light is incident from the upper surface side of the second blocking layer which is the uppermost portion in the photodetector element units. In this case, the light-absorbing layers in the photodetector element units have different thickness and the thickness of the light-absorbing layer of the photodetector element unit which is closer to the light incidence surface is less than the thickness of the light-absorbing layer of the photodetector element unit which is farther from the light incidence surface. When two of the photodetector element units are stacked in the photodetector device of the upper surface incidence type, the combined thickness of the light-absorbing layers is preferably 0.4~1.0 μm.

The present invention in accordance with the second aspect thereof provides a photodetector device comprising a photodetector element unit which is formed by successive lamination of a first blocking layer of a first conductivity type semiconductor, a light-absorbing layer of an intrinsic semiconductor, and a second blocking layer of a second conductivity type semiconductor on a substrate, wherein a modulated signal light is received, absorbed by the light-absorbing layer, converted into an electric signal, and output to the outside. In particular, a plurality of light-absorbing sub-layers are provided as the light absorbing layer and a well layer having a band gap less than that of the light-absorbing sub-layers and forming an energy well in both the conductivity band and the valence band is provided between the light-absorbing sub-layers. It is preferred that in the photodetector element, first conductivity type InP may be used as the first blocking layer, i-type In$_y$Ga1—$_y$As (where y is a positive real number, and 1>y>0) be used as the light-absorbing layers, i-type In$_x$Ga1-$_x$As (where x is a positive real number, and 1>x>y) be used as the well layer, and second conductivity type InP be used as the second blocking layer.

Furthermore, the above-described photodetector device of the second aspect of the present invention comprises a first optical waveguide layer composed of a first conductivity type semiconductor and a second optical waveguide layer composed of a second conductivity type semiconductor. The first optical waveguide layer is provided between the first blocking layer and the light-absorbing sub-layer adjacent thereto. The band gap of the first optical waveguide layer is between those of the first blocking layer and light-absorbing sub-layer.

The second optical waveguide layer is provided between the second blocking layer and the light-absorbing sub-layer adjacent thereto. The band gap of the second optical waveguide layer is between those of second blocking layer and light-absorbing sub-layer. In this case, it is preferred that first conductivity type InP may be used as the first blocking layer, i-type In$_y$Ga$_{1-y}$As (where y is a positive real number, and 1>y>0) be used as the light-absorbing sub-layer, i-type In$_x$Ga$_{1-x}$As (where x is a positive real number; 1>x>y) be used as the well layer, second conductivity type InP be used as the second blocking layer, first conductivity type InGaAsP be used as the first optical waveguide layer, and second conductivity type InGaAsP be used as the second optical waveguide layer.

In the above-described photodetector device of the second aspect of the present invention, the first conductivity type is any one of n-type and p-type, and the second conductivity type is the other one of n-type and p-type.

The photodetector device of the second aspect of the present invention can be of an end surface incidence type in which the signal light is incident onto the end surface of each of the light-absorbing sub-layers. In this case, the thickness of the light-absorbing sub-layers is substantially the same. When two layers, a first light-absorbing sub-layer and a second light-absorbing sub-layer, are provided as the light-absorbing sub-layer, the thickness of each of the first light-absorbing sub-layer and second light-absorbing sub-layer is preferably within a range of 0.2~0.5 µm.

Furthermore, the photodetector device of the second aspect of the present invention can be of an upper surface incidence type in which the signal light is incident from the upper surface side of the second blocking layer. In this case, the light-absorbing sub-layers have different thickness and the thickness of the light-absorbing sub-layer which is closer to the light incidence surface is less than the thickness of the light-absorbing sub-layer which is farther from the light incidence surface. When two layers, a first light-absorbing sub-layer and a second light-absorbing sub-layer, are provided as the light-absorbing layer in the photodetector device of the upper surface incidence type, the combined thickness of the first and second light-absorbing sub-layers is preferably within a range of 0.4~1.0 µm.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENT

Initially, an embodiment of the first aspect of the present invention will be described below with reference to the drawings.

The photodetector device in accordance with the first aspect of the present invention comprises a photodetector element unit composed a first blocking layer composed of a first conductivity type semiconductor, a light-absorbing layer composed of an intrinsic semiconductor, and a second blocking layer composed of a second conductivity type semiconductor successively laminated on a substrate, wherein a modulated signal light is received, absorbed by the light-absorbing layer, converted into an electric signal, and output to the outside.

This photodetector device is constituted by laminating a plurality of photodetector element units as described above. In the below-described embodiment, the drawings schematically illustrate the shape, dimensions, and arrangement merely to facilitate the understanding of the present invention. Furthermore, the numerical values or materials described hereinbelow serve only for illustrative purposes. Accordingly, the present invention, is not limited to the present embodiment.

Figure 1:
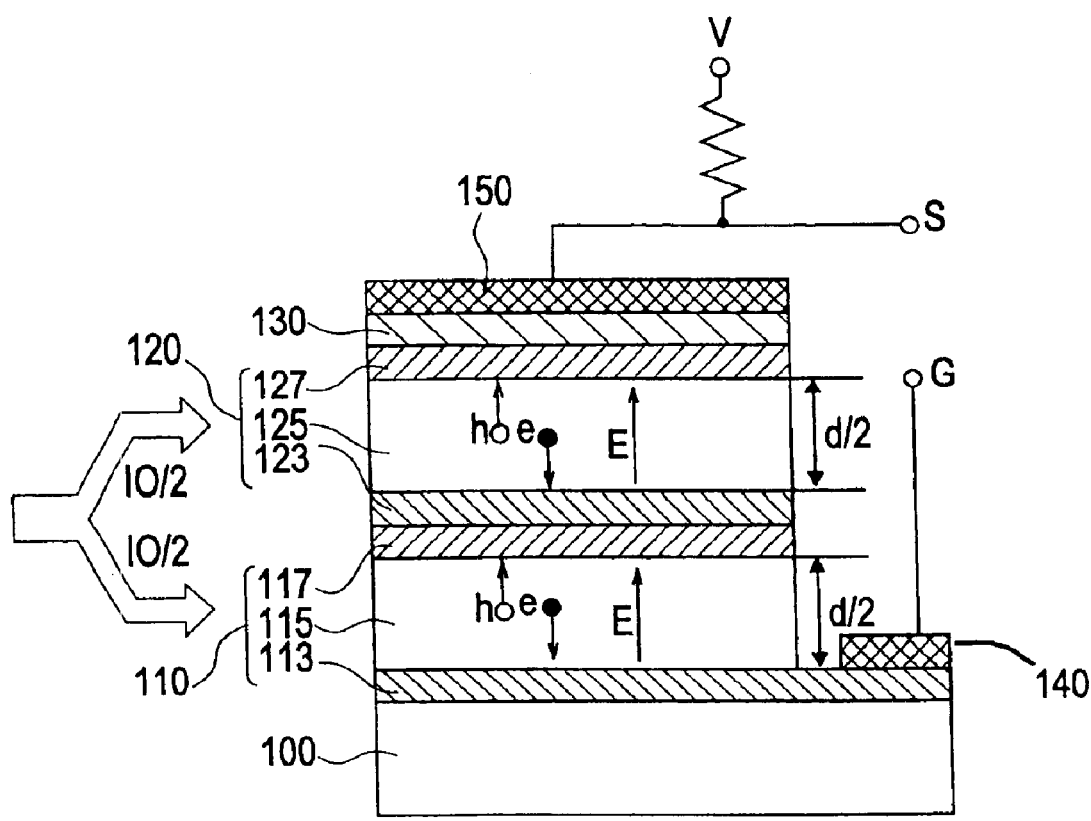
FIG. 1 is a cross-sectional view illustrating a schematic structure of a photodiode of an end surface incidence type having a pin-type configuration in accordance with the first embodiment of the first aspect of the present invention.

FIG. 1 is a cross-sectional view illustrating a schematic structure of a photodiode as a photodetector device of the first embodiment of the first aspect of the present invention. The photodiode of this first embodiment is a photodiode of an end surface incidence type in which the incident light I0 is incident from the end surface of a light-absorbing layer. This photodiode has a pin-type structure.

In FIG. 1, the reference numeral 100 stands for a semi-insulating substrate formed of InP (indium-phosphorus) having semiinsulating properties. The reference numeral 110 stands for a first photodiode unit formed on substrate 100. The first photodiode unit 110 has a structure obtained by successive lamination of a first n-type blocking layer 113 (thickness 0.5~1 µm), a first light-absorbing layer 115 (this light-absorbing Layer is also referred to as i-type layer or intrinsic semiconductor layer hereinbelow), and a first p-type blocking layer 117 (thickness 0.05~0.2 µm).

The first n-type blocking layer 113 is formed of $n^+$-type InP for preventing the injection of positive holes from the outside. The first light-absorbing layer 115 is formed of non-doped (i-type) $In_{0.53}Ga_{0.47}As$ (indium-gallium-arsenic) for absorption of light and generation of electron-hole pairs. The first p-type blocking layer 117 is formed of $p^+$-type InP for preventing the injection of electrons from the outside.

Furthermore, the reference numeral 120 stands for a second photodiode unit formed on the first photodiode 110 unit and having the structure substantially identical to that of the first photodiode unit 110. Thus, the second photodiode unit 120 has a structure obtained by successive lamination of a second n-type blocking layer 123 (thickness 0.05~0.2 µm) formed of $n^+$-type InP for preventing the injection of positive holes from the outside, a second light-absorbing layer (i-type layer or intrinsic semiconductor layer) 125 formed of non-doped (i-type) $In_{0.53}Ga_{0.47}As$ (indium-gallium-arsenic) for absorption of light and generation of electron-hole pairs, and a second p-type blocking layer 127 (thickness 0.5~1 µm) formed of $p^+$-type InP for preventing the injection of electrons from the outside.

The reference numeral 130 stands for a $p^{++}$-type $In_{0.53}Ga_{0.47}As$ contact layer (thickness about 0.1 µm) for ohmic contact with the electrode formed on the second p-type blocking layer 127. The reference numeral 140 stands for a first electrode electrically connected to the first n-type blocking layer 113 and formed by successive lamination of a gold-germanium alloy (AuGe), nickel (Ni), and gold (Au) (that is, a AuGe/Ni/Au laminated configuration) on the end portion of the first n-type blocking layer 113. The reference numeral 150 stands for a second electrode electrically connected to the contact layer 130 and formed by successive lamination of titanium (Ti), platinum (Pt), and gold (Au) (that is, a Ti/Pt/Au laminated configuration) on the contact layer 130. The reference character S stands for an output signal terminal, G for a ground terminal, and V for a power source terminal.

When such photodiode is driven, a voltage of about −3~−5 V (volts) is applied to the power source terminal V and the ground terminal G is grounded. Furthermore, d/2 stands for a thickness of each of the first and second light-absorbing layers 115 and 125. The thickness d/2 is half of the thickness d (0.4~1.0 μm) of the light-absorbing layer in the conventional monolayer photodiode, that is, d/2 is 0.2~0.5 μm. Furthermore, characters h, e, and E, stand for holes, electrons, and electric field, respectively.

A method for the fabrication of the photodiode will be described below. The first n-type blocking layer 113 (thickness 0.5~1 μm) of n$^+$-type InP, the first light-absorbing layer 115 (i-type or intrinsic semiconductor layer) of non-doped (i-type) In$_{0.53}$Ga$_{0.47}$As, and first p-type blocking layer 117 (thickness 0.05~0.2 μm) of p$^+$-type InP are successively epitaxially grown on the semiinsulating InP substrate 100 by a MOCVD method (metalloorganic chemical vapor deposition method) or MBE method (molecular beam epitaxy method). As a result, the first photodiode unit 110 having a pin-type structure is formed.

Furthermore, the second photodiode unit 120 having a pin-type structure is formed by successively epitaxially growing the second n-type blocking layer 123 (thickness 0.05~0.2 μm), second light-absorbing layer 125, second p-type blocking layer 127 (thickness 0.5~1 μm) on the first photodiode unit 110 so as to obtain the composition and laminated structure identical to those of the first photodiode unit 110.

Then, a contact layer 130 (thickness about 0.1 μm) of p$^{++}$-type In$_{0.53}$Ge$_{0.47}$As for obtaining an ohmic characteristic is epitaxially grown on the second photodiode unit 120. The preset portion (for example, an end portion) is thereafter etched out to the surface of the first n-type blocking layer 113 by dry etching with CH$_4$/H$_2$ series etching gas and a rectangular photodiode island is formed. The surface of the end portion of the first n-type blocking layer 113 is exposed by this etching.

Titanium (Ti), platinum (Pt), and gold (Au) are then successively vapor deposited and laminated on the contact layer 130. A pattern of the second electrode 150 with a Ti/Pt/Au laminated structure electrically connected to the contact layer 130 is then formed by the ordinary photolithography and wet etching and then a gold-germanium alloy (AuGe), nickel (Ni), and gold (Au) are successively vapor deposited and laminated on the exposed end portion of the first n-type blocking layer 113. A pattern of the first electrode 140 with a AuGe/Ni/Au laminated structure electrically connected to the first n-type blocking layer 113 is then formed by the ordinary photolithography and wet etching. As a result, a photodiode with a pin-type structure of an end surface incidence type is obtained which has a configuration shown in FIG. 1. In such structure, all the adjacent layers from the substrate 100 to the contact layer 130 have matching lattices.

Furthermore, the thickness of each of the first and second light-absorbing layers 115, 125 is 0.2~0.5 μm (that is, d/2) which is half of the typical value d (0.4~1.0 μm) of a light-absorbing layer of an ordinary pin-type photodiode with a monolayer configuration. To facilitate understanding, the thickness of the first and second light-absorbing layers 115, 125 in FIG. 1 is enlarged.

During driving of the above-described pin-type photodiode of an end surface incidence type (see FIG. 1), a signal light (wavelength λ=1.55 μm) modulated with a preset modulation frequency (for example, no less than 40 Gb/s) is incident in respective end surfaces of the first and second light-absorbing layers 115, 125 and absorbed by the first and second light-absorbing layers 115, 125.

Electron-hole pairs are generated in the first and second light-absorbing layers 115, 125 by the absorbed signal light. Electrons generated in respective light-absorbing layers drift toward the n-type blocking layers corresponding to the light-absorbing layers under the effect of electric field E applied in both light-absorbing layers 115, 125. On the other hands, holes generated in the respective light-absorbing layers drift toward the p-type blocking layers corresponding to the light-absorbing layers.

In such photodiode the total thickness of the first light-absorbing layer 115 and second light-absorbing layer 125 is d and this thickness is the same as that of the conventional monolayer photodiode. Therefore, the intensity of internal electric filed is not changed.

However, the thickness of each of the light-absorbing layers 115, 125 is d/2 and this thickness is half of the thickness d of the conventional monolayer photodiode. Therefore, the time $\tau_{tr}$ (maximum travel time of electrons and holes) required for the electrons (holes) generated in the respective light-absorbing layers 115, 125 to reach the n-type blocking layer (p-type blocking layer) corresponding to the respective light-absorbing layers is half that of the conventional monolayer photodiode.

The electrons and holes that reached the first p-type blocking layer 117 and the second n-type blocking layer 123 sandwiched between the first and second light-absorbing layers 115, 125 undergo recombination and annihilation. However, the electrons and holes that reached the uppermost second p-type blocking layer 127 and the first n-type blocking layer 113 at the interface with substrate are led out to the outside from the output signal terminal S as an electric current.

Furthermore, the band width of the photodiode is maximized by setting the total thickness d of the light-absorbing layers so that the relationship $\tau_{CR}=\tau_{tr}$ is satisfied between the CR time constant $\tau_{CR}$ for charging and discharging of the photodiode and the maximum travel time $\tau_{tr}$ of the carriers. Therefore, when the combined thickness d of the first and second light-absorbing layers 115, 125 of the photodiode is optimized so that the condition $\tau_{CR}=\tau_{tr}$ is satisfied, the band width can be increased by a factor of $2^{1/2}$ by comparison with the case in which the thickness d of light-absorbing layer is similarly optimized in the conventional monolayer pin-type photodiode.

With the photodiode of the above-described first embodiment, the configuration provided with two photodiode units, that is, the structure in which the first photodiode unit and second photodiode unit were stacked as two layers, makes it possible to double the response speed of the photodiode of the present invention by comparison with the response speed of the conventional photodiode having a monolayer configuration. Therefore, a photodiode can be realized which has a response providing for good operation even with respect to a signal light modulated with a high modulation frequency if no less than 40 Gb/s that could not be employed in the conventional pin-type photodiodes of an end surface incidence type having a monolayer configuration.

However, since the amount of light incident upon one photodiode unit is half of that in the conventional photodiode with a monolayer configuration, the sensitivity (photocurrent) is also halved. Similarly, when n (here, n is integer of no less than 3) layers of photodiode units are stacked and the thickness of the light-absorbing layer in each photodiode is made d/n, the maximum travel time $\tau_{tr}$ of carriers (electrons or holes) can be reduced as 1/n and the band width obtained when the total thickness d of the light-absorbing layers is optimized is increased by a factor of $n^{1/2}$ with respect to that of the conventional monolayer pin-type photodiode in which the thickness of the light-absorbing layer is d. Therefore, even greater increase in the operation rate can be expected.

In this case, too, the amount of light incident onto one photodiode is 1/n and the sensitivity is decreased. However, the above-described decrease in sensitivity can be fully compensated by providing an amplifier at the next stage.

The second embodiment of the first aspect of the present invention will be described hereinbelow.

Figure 2:
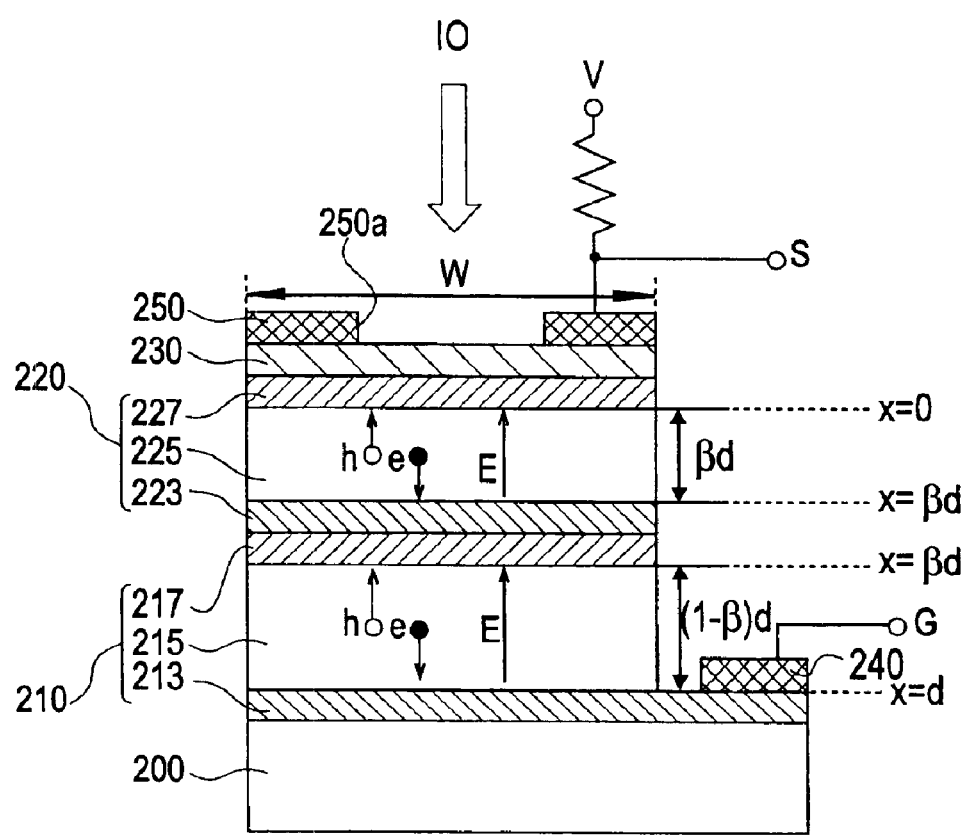
FIG. 2 is a cross-sectional view illustrating a schematic structure of a photodiode of an upper surface incidence type having a pin-type configuration in accordance with the second embodiment of the first aspect of the present invention.

FIG. 2 is a cross-sectional view schematically illustrating the structure of a photodiode which is a photodetect or device of the second embodiment of the first aspect of the present invention. The photodiode of the second embodiment is a photodiode of an upper surface incidence type in which the incident light I0 is received by the upper surface side and which has a pin-type structure.

In FIG. 2, the reference numeral 200 stands for a semi-insulating substrate composed of InP having semiinsulating properties. The reference numeral 210 stands for a first photodiode unit formed on substrate 200. The first photodiode unit 210 has a structure obtained by successive lamination of a first n-type blocking layer 213 (thickness 0.5~1 μm) of r$^+$-type InP for preventing the injection of positive holes from the outside, a first light-absorbing layer (this light-absorbing layer is also referred to as i-type layer or intrinsic semiconductor layer hereinbelow) 215 of non-doped (i-type) $In_{0.53}Ga_{0.47}As$ for absorption of light and generation of electron-hole pairs, and a first p-type blocking layer 217 (thickness 0.05~0.2 μm) of p$^+$-type InP for preventing the injection of electrons from the outside.

Furthermore, the reference numeral 220 stands for a second photodiode unit formed on the first photodiode unit 210 and having the structure substantially identical to that of the first photodiode unit 210. Thus, the second photodiode unit 220 has a structure obtained by successive lamination of a second n-type blocking layer 223 (thickness 0.05~0.2 μm) formed of n$^+$-type InP for preventing the injection of positive holes from the outside, a second light-absorbing layer (i-type layer or intrinsic semiconductor layer) 225 formed of non-doped (i-type) $In_{0.53}Ga_{0.47}As$ for absorption of light and generation of electron-hole pairs, and a second p-type blocking layer 227 (thickness 0.5~1 μm) formed of p$^+$-type InP for preventing the injection of electrons from the outside.

The reference numeral 230 stands for a p$^{++}$-type $In_{0.53}Ga_{0.47}As$ contact layer (thickness about 0.1 μm) for ohmic contact with the electrode formed on the second p-type blocking layer 227. The reference numeral 240 stands for a first electrode electrically connected to the first n-type blocking layer 213 and formed by successive lamination of a gold-germanium alloy (AuGe), nickel (Ni), and gold (Au) (that is, a AuGe/Ni/Au laminated configuration) on the first n-type blocking layer 213. The reference numeral 250 stands for a second electrode electrically connected to the contact 230 and formed by successive lamination of titanium (Ti), platinum (Pt), and gold (Au) (that is, a Ti/Pt/Au laminated configuration) on the contact layer 230. An opening 250a is provided in the second electrode 250 correspondingly to the region in which the signal light incident from the upper surface is received. The reference character S stands for an output signal terminal, G for a ground terminal, and V for a power source terminal.

When such photodiode is driven, a voltage of about −3~−5 V (volts) is applied to the power source terminal V and the ground terminal G is grounded. Furthermore, h stands for holes, e stands for electrons, E stands for an electric field, and W stands for a width of the photodetector element unit.

The composition of layers, laminated structure, and process for the fabrication of the photodiode of the second embodiment are basically identical to those of the photodiode of the first embodiment. Furthermore, in this structure, too, the adjacent layers, form the substrate 200 to contact layer 230, have matching lattices.

The important difference between the photodiode of the second embodiment and the photodiode of the first embodiment is in that the photodiode of the second embodiment is of an upper surface incidence type, the first and second light-absorbing layers 215, 225 have different thickness because the amount of absorbed light is not uniform in the longitudinal direction, and the width W of the element unit in the photodiode of the second embodiment is made greater than that of the photodiode of the first embodiment to increase the light receiving surface because it is of an upper surface incidence type.

The photodiode of the second embodiment is of an upper surface incidence type and, as mentioned above, the amount of absorbed light is not uniform in the longitudinal direction. Therefore, the speed of operation is increased by making the first and second light-absorbing layers 215, 225 of different thickness. More specifically the thickness of the first light-absorbing layer 215 is (1−β)d, and the thickness of the second light-absorbing layer 225 is βd. Here, a factor β is set within a range 0<β<0.5, and d is the thickness, d=0.4~1.0 μm, of the light-absorbing layer of the conventional monolayer photodiode of an upper surface incidence type.

The increase in the operation speed attained by setting the thickness of the first and second light-absorbing layers 215, 225 as indicated above will be described below.

Here, x will denote the distance from the interface between the second light-absorbing layer 225 and second p-type blocking layer 227 (this interface will be a reference point x=0) to the interface between the first n-type blocking layer 213 and first light-absorbing layer 215. In this case, the interlayers between the first and second light-absorbing layers 215, 225 (more specifically, the first p-type blocking layer 217 and second n-type blocking layer 223) absorb the light. However, since the thickness of both those layers is small by comparison to that of the light-absorbing layers, they can be ignored and not taken into account in the distance x.

If during driving the signal light is incident from the upper part (x=0), the photocarrier generation rate G(x) in the first and second light-absorbing layers can be represented by the following formula (1).

$$G(x)=G_0(1-R)\alpha\exp(-\alpha x) \quad (1)$$

where $G_0$ stands for a photon density in the incident light, R is a reflection factor, and α is a light absorption coefficient of the light-absorbing layers with respect to incident light.

The electron current density, $J_n(x)$, and hole current density, $J_p(x)$, in the light-absorbing layer can be represented by the following formulas (2a), (2b).

$$J_n(x) = q \, v_n n(x) \tag{2a}$$

$$J_p(x) = q \, v_p p(x) \tag{2b}$$

where q stands for an elementary charge, $v_n$ and $v_p$ stand for a speed of electrons and holes, respectively, n(x) stands for an electron density per unit volume (1 cm$^3$) in the light-absorbing layer in a position at a distance x, and p(x) stands for a hole density per unit volume (1 cm$^3$) in the light-absorbing layer in a position at a distance x.

Carrier continuity equations are represented by the following formulas (3a), (3b).

$$(dn(x)/dt) = G(x) + (1/q) div J_n(x) \tag{3a}$$

$$(dp(x)/dt) = G(x) - (1/q) div J_p(x) \tag{3b}$$

Therefore, if the electron current density $J_n(x)$ and hole current density $J_p(x)$ represented by the above-described formulas (2a), (2b) are substituted into formulas (3a), (3b) above, the following formulas (4a), (4b) can be obtained in a stationary state.

$$(dn(x)/dt) = G(x) - (d(v_n n(x))/dx) = 0 \tag{4a}$$

$$(dp(x)/dt) = G(x) + (d(v_p p(x))/dx) = 0 \tag{4b}$$

Here, $J_{n1}(x)$ stands for an electron current density and $J_{p1}(x)$ stands for a hole current density in the first light-absorbing layer 215, and $J_{n2}(x)$ stands for an electron current density and $J_{p2}(x)$ stands for a hole current density in that second light-absorbing layer 225. Now suppose that $J_{n2}(0) = 0$, $J_{p2}(\beta d) = 0$ when $0 \leq x \leq \beta d$ (second light-absorbing layer 225) and also suppose that $J_{n1}(\beta d) = 0$, $J_{p1}(d) = 0$ when $\beta d \leq x \leq d$ (first light-absorbing layer 215) as boundary conditions, where a thickness of the second light-absorbing layer 225 which is the upper layer is denoted by $\beta d$ ($0 < \beta < 0.5$) and the thickness of the first light-absorbing layer 215 which is the lower layer is denoted by $(1-\beta)d$, then in the range $0 \leq x \leq \beta d$, $$J_{n2}(x) = qG_0(1-R)(1-\exp(-\alpha x)) \tag{5a}$$

$$J_{p2}(x) = -qG_0(1-R)(\exp(-\alpha\beta d) - \exp(-\alpha x)) \tag{5b}$$

$$J_2(x) = J_{n2}(x) + J_{p2}(x) = qG_0(1-R)(1-\exp(-\alpha\beta d)) \tag{5}$$

where $J_2(x)$ is the total current density in the second light-absorbing layer 225.

Furthermore, in the range of $\beta d \leq x \leq d$, $$J_{n1}(x) = qG_0(1-R)(\exp(-\alpha\beta d) - \exp(-\alpha x)) \tag{6a}$$

$$J_{p1}(x) = -qG_0(1-R)(\exp(-\alpha d) - \exp(-\alpha x)) \tag{6b}$$

$$J_1(x) = J_{n1}(x) + J_{p1}(x) = qG_0(1-R)(\exp(-\alpha\beta d) - \exp(-\alpha d)) \tag{6c}$$

where $J_1(x)$ is the total current density in the first light-absorbing layer 215.

Therefore, in the intermediate pn junction (that is junction on the first p-type blocking layer 217 and second n-type blocking layer 223) the following condition should be satisfied for a complete recombination of the carriers:

$$J_{n2}(\beta d) = J_{p1}(\beta d), \text{ that is,}$$

$$1 - \exp(-\alpha\beta d) = \exp(-\alpha\beta d) - \exp(-\alpha d) \tag{7a}$$

Therefore, $\beta$ can be expressed as $$\beta = \ln\{2/(1+\exp(-\alpha d))\}/(\alpha d) \tag{7b}$$

If $\tau_{trn}$ denotes the maximum travel time of the carrier in the first and second light-absorbing layers 215, 225 in case of electrons and $\tau_{trp}$ in case of holes, then the following equations will be valid:

$$\tau_{trn2} = \beta d/v_n, \tau_{trp2} = \beta d/v_p \tag{8a}$$

$$\tau_{trn1} = (1-\beta)d/v_n, \tau_{trp1} = (1-\beta)d/v_p \tag{8b}$$

Here, index 1 relates to the first light-absorbing layer 215 and index 2 relates to the second light-absorbing layer 225.

Since $v_n > v_p$ in the i-type InGaAs, the following conditions are satisfied: $\tau_{trp1} > \tau_{trn1}$, $\tau_{trp2} > \tau_{trn2}$.

Furthermore, since $0 < \beta < 0.5$, the following condition is satisfied: $\tau_{trp1} > \tau_{trp2}$.

Therefore, the maximum travel time of the carriers in the present element is $\tau_{trp1} = (1-\beta)d/v_p$.

When no intermediate pn junction is present, that is, in case of the above-described conventional monolayer photodiode of an upper surface incidence type, the maximum travel time of the carriers is $\tau_{trp} = d/v_p$. By contrast, in the photodiode of the second embodiment, the insertion of the intermediate pn junction (that is, a junction of the first p-type blocking layer 217 and second n-type blocking layer 223) shortens the conventional maximum travel time of the carriers by a factor of $(1-\beta)$. Therefore, the photodiode of the second embodiment can operate at a rate faster than that of the above-described conventional monolayer photodiode of an upper surface incidence type. Thus, a photodiode can be realized which has a response speed allowing for the effective operation even with respect to a signal light modulated with a high modulation frequency of no less than 20 Gb/s that was not suitable for the conventional pin-type photodiodes of an upper surface incidence type that had a monolayer configuration.

The first aspect of the present invention is not limited to the above-described embodiments, and various modifications can be incorporated according to the design.

For example, in the above-described embodiments, a pin-type photodiode of an InP/InGaAs system for high-speed optical communications was considered, but the structure of each of a plurality of photodiode units is not limited to a p$^+$-type InP layer (p-type blocking layer)/i-type InGaAs layer (light-absorbing layer)/n$^+$-type InP layer (n-type blocking layer) laminated configuration. For example, the same effect can be expected with a p$^+$-type InP layer (p-type blocking layer)/p-type InGaAsP layer (p-type optical waveguide layer)/i-type InGaAs layer (light-absorbing layer)/n-type InGaAsP layer (n-type optical waveguide layer)/n$^+$-type InP layer (n-type blocking layer) laminated configuration in which InGaAsP layers having a band gap between those of the InP layers (blocking layers) and InGaAs layer (light-absorbing layer) are introduced as optical waveguide layers between those layers. In this case, the layers are also lattice matched to each other.

Figure 6:
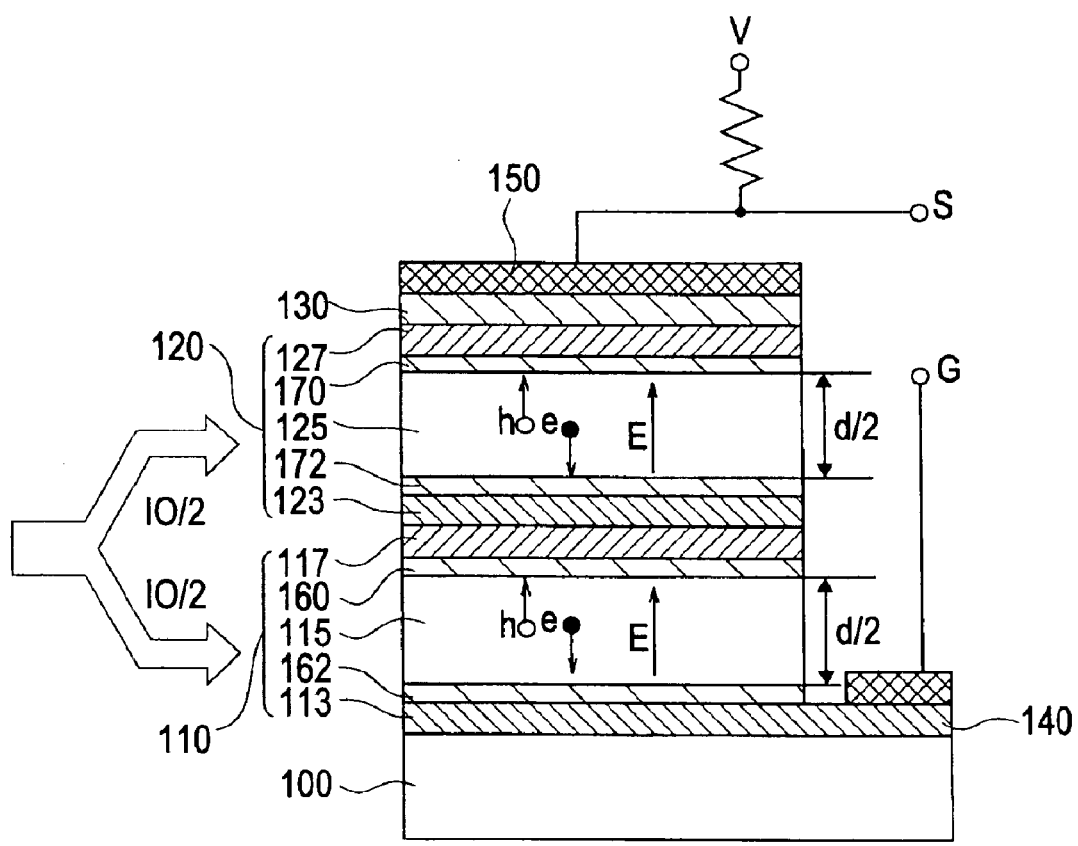
FIG. 6 is a cross-sectional view illustrating a schematic modified structure of that shown in FIG. 1.
Figure 7:
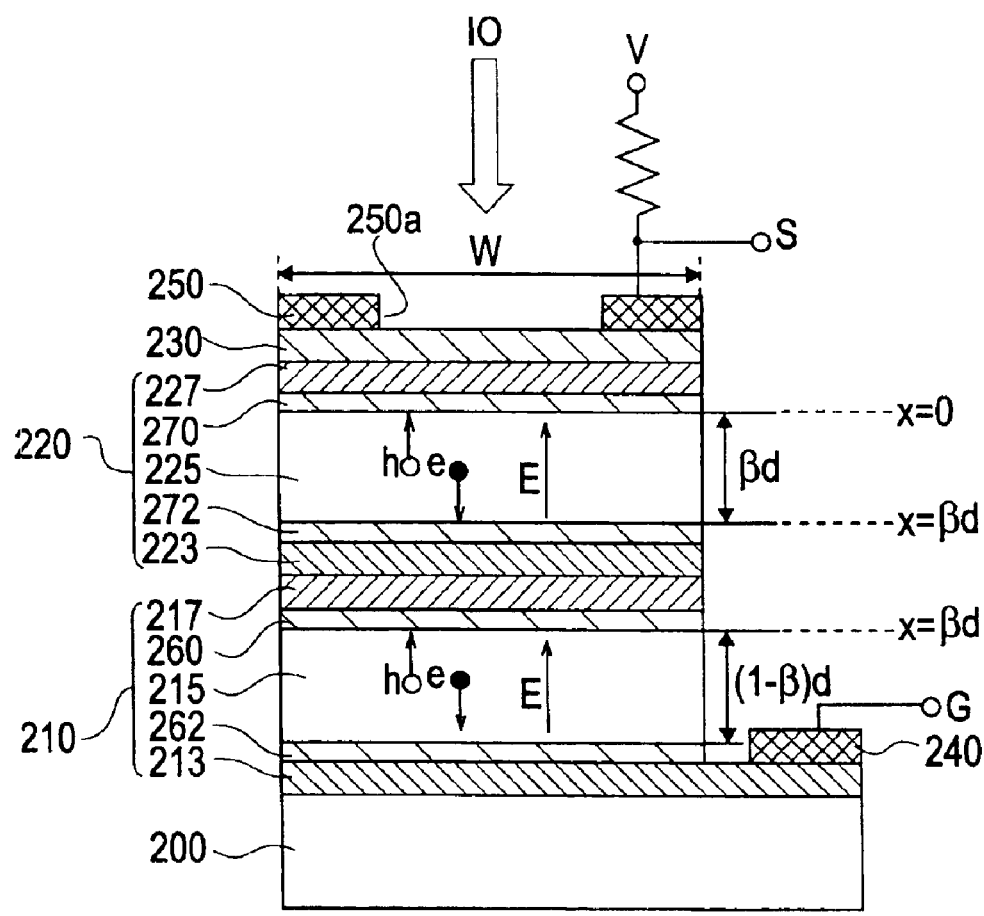
FIG. 7 is a cross-sectional view illustrating a schematic modified structure of that shown in FIG. 2.

FIGS. 6 and 7 show modified examples of the structures shown in FIGS. 1 and 2, respectively. In FIG. 6, the first conductivity type (for example, p-type) optical waveguide layers is shown by 160 and 170, respectively, and the second conductivity type (for example, n-type) optical waveguide layers is shown by 162 and 172, respectively. In FIG. 7, the first conductivity type optical waveguide layers is shown by 260 and 270, respectively, and the second conductivity type optical waveguide layers is shown by 262 and 272, respectively.

Moreover, various modifications can be considered as other epitaxial structures. Furthermore, the same effect can be also expected from a nip-type photodiode having a structure inverted with respect to the pin-type structure.

The materials constituting the photodiode of the first aspect of the present invention are not limited to the above-described materials, and the same effect can be expected from pin-type photodiodes using other materials, for example, GaAs, AlGaAs, Si, and Ge.

An embodiment of the present invention in accordance with the second aspect thereof will be described below. The photodetector element in accordance with the second aspect of the present invention comprises a photodetector element unit composed of a first blocking layer constituted by a first conductivity type semiconductor, a light-absorbing layer composed of an intrinsic semiconductor, and a second blocking layer composed of a second conductivity type semiconductor successively laminated on a substrate, wherein a modulated signal light is received, absorbed by the light-absorbing layer, converted into an electric signal, and output to the outside. This photodetector element comprises a plurality of light-absorbing layers as the light-absorbing layer. Well layers having a band gap less than that of the light-absorbing layers and forming energy wells in both the conduction band and the valence band are provided between those light-absorbing layers.

In the below-described embodiment, the figures schematically illustrate the shaper dimensions, and arrangement merely to facilitate the understanding of the present invention. Furthermore, the numerical values or materials described hereinbelow serve only for illustrative purposes. Accordingly, the present invention, is not limited to the present embodiment.

Figure 8:
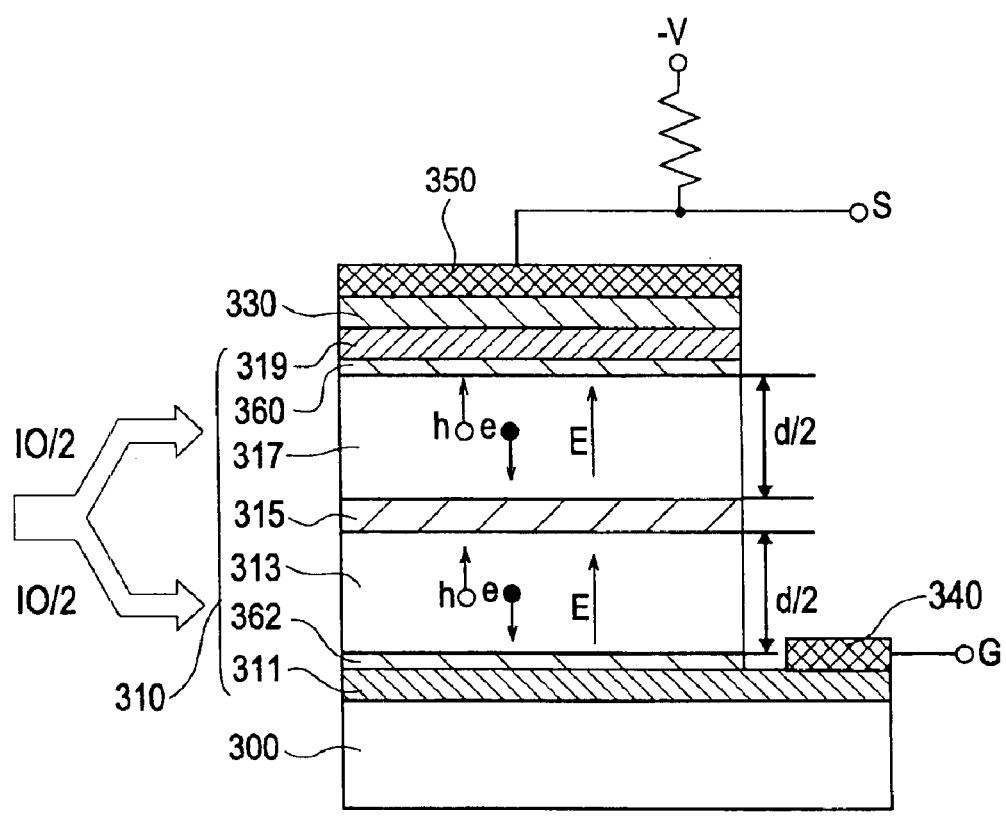
FIG. 8 is a cross-sectional view illustrating a schematic modified structure of that shown in FIG. 3.

FIG. 8 is a cross-sectional view illustrating a schematic structure of a photodiode as a photodetector device of the first embodiment of the second aspect of the present invention. The photodiode of the present embodiment is a photodiode of an end surface incidence type in which the incident light I0 is received from the end surface of a light-absorbing layer. This photodiode has a pin-type structure.

Figure 3:
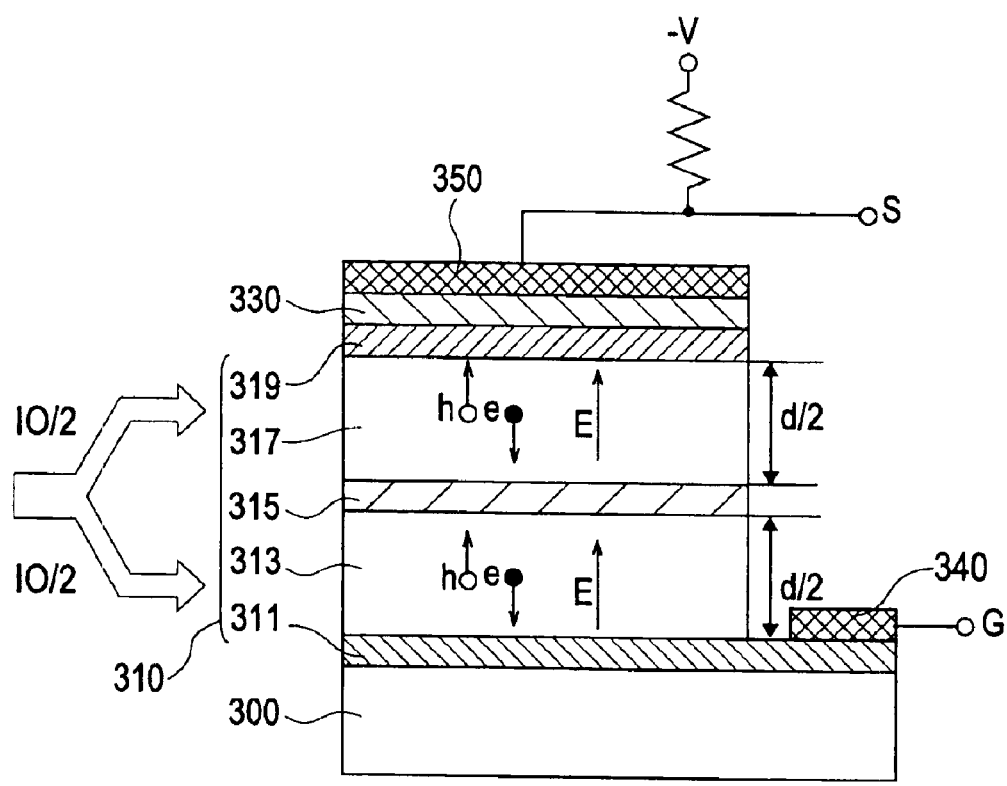
FIG. 3 is a cross-sectional view illustrating a schematic structure of a photodiode of an end surface incidence type having a pin-type configuration in accordance with the first embodiment of the second aspect of the present invention.

In FIG. 3, the reference numeral 300 stands for a semiinsulating substrate formed of InP (indium-phosphorus having semiinsulating properties. The reference symbol 310 stands for a photodiode unit formed on substrate 300. The photodiode unit 310 has a structure obtained by successive lamination of an n-type blocking layer 311, a first light-absorbing layer (this light-absorbing layer is also referred to as i-type layer or intrinsic semiconductor layer hereinbelow) 313, a well layer 315, a second light-absorbing layer (this light-absorbing layer is also referred to as i-type layer or intrinsic semiconductor layer hereinbelow) 317, and a p-type blocking layer 319 (thickness 0.5~1 μm). These first and second light-absorbing layers are also called as first and second sub-absorbing layers, respectively.

The n-type blocking layer 311 is formed of n$^+$-type InP for preventing the injection of positive holes from the outside and a thickness thereof is within a range of 0.5~1 μm. The first light-absorbing layer 313 is formed of non-doped (i-type) In$_{0.53}$Ga$_{0.47}$As (indium-gallium-arsenic) for absorption of light and generation of electron-hole pairs. The well layer 315 is formed of non-doped (i-type) In$_x$Ga$_{1-x}$As (where 1>x>0.53; in the present example, x=0.70) so as to have a small thickness and a band gap smaller than that of the first light-absorbing layer (In$_{0.53}$Ga$_{0.47}$As). The second light-absorbing layer 317 is formed of non-doped (i-type) In$_{0.53}$Ga$_{0.47}$As for absorption of light and generation of electron-hole pairs so as to have the same composition and thickness as the first light-absorbing layer 313. The p-type blocking layer 319 is formed of p$^+$-type InP for preventing the injection of electrons from the outside and has a thickness within a range of 0.5~1 μm.

The reference numeral 330 stands for a p$^{++}$-type In$_{0.53}$Ga$_{0.47}$As contact layer (thickness about 0.1 μm) for ohmic contact with the electrode formed on the p-type blocking layer 319. The reference numeral 340 stands for a first electrode electrically connected to the n-type blocking layer 311 and formed by successive lamination of a gold-germanium alloy (AuGe), nickel (Ni), and cold (Au) (that is, a AuGe/Ni/Au laminated configuration) on the end portion of the n-type blocking layer 311. The reference numeral 350 stands for a second electrode electrically connected to the contact layer 330 and formed by successive lamination of titanium (Ti), platinum (Pt), and gold (Au) (that is, a Ti/Pt/Au laminated configuration) on the contact layer 330. The reference character S stands for an output signal terminal, G for a ground terminal, and V for a power source terminal.

When such photodiode is driven, a voltage of about −3~−5 V (volts) is applied to the power source terminal V and the ground terminal G is grounded. Furthermore, d/2 stands for a thickness of each of the first and second light-absorbing layers. The thickness d/2 is half of the thickness d (0.4~1.0 μm) of the light-absorbing layer in the conventional monolayer photodiode, that is, d/2 is 0.2~0.5 μm. Furthermore, characters h, e, and E stand for holes, electrons, and electric field, respectively.

The above-described layers were formed so as to provide for lattice matching between the substrate 300 and n-type blocking flyer n$^+$-type InP) 311, between the n-type blocking layer (n$^+$-type InP) 311 and first light-absorbing layer 313, between the second light-absorbing layer 317 and p-type blocking layer 319 (p$^+$-type InP), and between the p-type blocking layer 319 (p$^+$-type InP) and contact layer 330.

The well layer (i-type In$_x$Ga$_{1-x}$As) 315, as described above, is provided between the first light-absorbing layer 313 and second light-absorbing layer 317 and serves to form a band valley (energy well) in both the conduction band and the valence band. The well layer 315 has an In content ratio higher than that in the first and second light-absorbing layers 313, 317 and the configuration thereof is such that the band gap with the light-absorbing layers is decreased. If the thickness of the well layer 315 is increased, the amount of absorbed light is increased. Therefore, it is preferred that the thickness of the well layer be no more than 100 nm. On the other hand, if the thickness thereof is too small, the probability of carriers passing though the well layer without recombination is increased. Therefore, it is preferred that the thickness of the well layer be no less than 5 nm.

A method for the fabrication of the photodiode will be described below. The n-type blocking layer 311 (thickness 0.5~1 μm) of n$^+$-type InP, the first light-absorbing layer (sub-layer) 313 (thickness 0.2~0.5 μm) of non-doped (that is, i-type) In$_{0.53}$Ga$_{0.47}$As, the well layer 315 (thickness 5~100 nm) of non-doped (that is, i-type) In$_x$Ga$_{1-x}$As (where 1>x>0.53; in the present example, x=0.70) having a small thickness and a band gap less than that of the first light-absorbing layer (In$_{0.53}$Ga$_{0.47}$As) 313, the second light-absorbing layer (sub-layer) 317 (thickness 0.2~0.5 μm) of non-doped (that is, i-type) In$_{0.53}$Ga$_{0.47}$As having the same composition and thickness as the first light-absorbing layer 313, and the p-type blocking layer 319 (thickness 0.5~1 μm) of p$^+$-type InP lattice matched with the second light-absorbing layer (In$_{0.53}$Ga$_{0.47}$As) 317 are successively epitaxially grown on the semiinsulating InP substrate 300 by a MOCVD method (metalloorganic chemical vapor deposition method) or MBE method (molecular beam epitaxy method). As a result, the first photodiode unit 310 having a pin-type structure is formed.

Then, using a similar method, contact layer 330 (thickness about 0.1 μm) of p$^{++}$-type $In_{0.53}Ge_{0.47}As$ for obtaining an ohmic characteristic is epitaxially grown on the p-type blocking layer 319. The preset portion (for example, an end portion) is thereafter etched so as to reach the surface of the n-type blocking layer 311 by dry etching using $CH_4/H_2$ series etching gas, and a rectangular island-like region is formed. The surface of the end portion of the n-type blocking layer 311 is thus exposed.

Titanium (Ti), platinum (Pt), and gold (Au) are then successively vapor deposited and laminated on the contact layer 330. A pattern of the second electrode 350 with a Ti/Pt/Au laminated structure electrically connected to the contact layer 330 is then formed by the ordinary photolithography and wet etching. Furthermore, a gold-germanium alloy (AuGe), nickel (Ni), and gold (Au) are successively vapor deposited and laminated on the exposed end portion of the n-type blocking layer 311 and then a pattern of the first electrode 340 with a AuGe/Ni/Au laminated structure electrically connected to the n-type blocking layer 311 is then formed by the ordinary photolithography and wet etching. As a result, a photodiode with a pin-type structure of an end surface incidence type is obtained which has a configuration shown in FIG. 3.

Furthermore, the thickness of each of the first and second light-absorbing layers 313, 317 is 0.2~0.5 μm (that is, d/2) which is half of the typical value d (0.4~1.0 μm) of a light-absorbing layer of an ordinary pin-type photodiode with a monolayer configuration. To facilitate understanding, the thickness of the first and second light-absorbing layers 313, 317 in FIG. 3 is enlarged.

Figure 4:
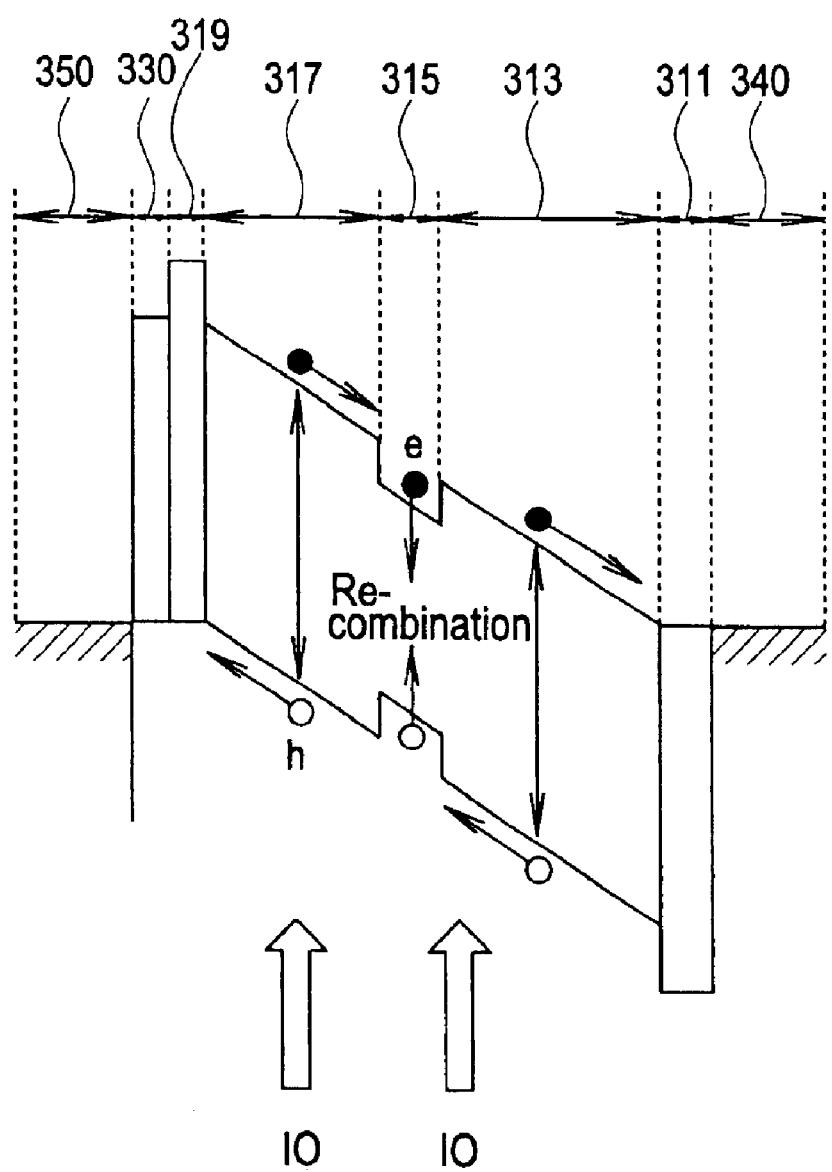
FIG. 4 illustrates an energy band of a photodiode of an end surface incidence type having a pin-type configuration in accordance with the first embodiment of the second aspect of the present invention.

The operation of such photodiode will be explained below with reference to FIG. 3 and FIG. 4. FIG. 4 illustrates an energy band of the photodiode of the present embodiment during operation.

When the above-described pin-type photodiode of an end surface incidence type (see FIG. 3) is driven, a signal light (λ=1.55 μm) modulated with a preset modulation frequency (for example, no less than 40 Gb/s) is incident in respective end surfaces of the first and second light-absorbing layers (sub-layers) 313, 317 and absorbed by the first and second light-absorbing layers 313, 317. Electron-hole pairs are generated in the first and second light-absorbing layers 313, 317 by the absorbed signal light (λ=1.55 μm). Electrons generated in respective light-absorbing layers drift toward the n-type blocking layer 311 under the effect of electric field E applied in the first and second light-absorbing layers 313, 317. Holes generated in respective light-absorbing layers drift toward the p-type blocking layer 319.

However, since the band gap of the i-type $In_xGa_{1-x}As$ layer 315 (1>x>0.53; for example, x=0.70) sandwiched between the first and second light-absorbing layers 313, 317 is less than that of the first and second light-absorbing layers 313, 317 ($In_{0.53}Ga_{0.47}As$), the well layer 315 is formed. The electrons generated in the second light-absorbing layer 317 and drifting toward the n-type blocking layer 311 and the holes generated in the first light-absorbing layer 313 and drifting toward the p-type blocking layer 319 are trapped in the well layer 315 and eventually undergo recombination and annihilation.

Therefore, the holes that were generated in the second light-absorbing layer 317 and reached the p-type blocking layer 319 and the electrons that were generated in the first light-absorbing layer 313 and reached the n-type blocking layer 311 are led out to the outside as an electric current.

The well layer ($In_xGa_{1-x}As$) 315 is formed to have a thickness less than that of the light-absorbing sub-layers ($In_{0.53}Ga_{0.47}As$) 313, 317. By forming the well layer so that the thickness thereof is significantly less than that of the light-absorbing sub-layers, it is possible to obtain the thickness of the entire photodiode substantially equal to that of the conventional monolayer photodiode. For this reason, the intensity of the internal electric field of this photodiode is not changed with respect to that of the conventional monolayer photodiode, and the speed of carriers is also not changed.

However, since the thickness of light-absorbing sub-layers is half of the thickness of the conventional monolayer photodiodes, the time (maximum travel time of carriers) $\tau_{tr}$ required for the holes generated in the second light-absorbing layer 317 to reach the p-type blocking layer 319 and for the electrons generated in the first light-absorbing layer to reach the n-type blocking layer 311 is reduced by half, that is reduced to half of the conventional time.

Furthermore, the band width of the photodiode is maximized by setting the total thickness d of the light-absorbing layers so that the relationship $\tau_{CR=\tau tr}$ is satisfied between the CR time constant $\tau_{CR}$ for charging and discharging of the photodiode and the maximum travel time $\tau_{tr}$ of carriers. Therefore, when the combined thickness d of the first and second light-absorbing sub-layers 313, 317 of the photodiode is optimized so that the condition $\tau_{CR}=\tau_{tr}$ is satisfied, the band width can be increased by a factor of $2^{1/2}$ by comparison with the case in which the thickness d of the light-absorbing layer is similarly optimized in the conventional monolayer pin-type photodiode.

With the above-described configuration of the first embodiment of the present invention according to the second aspect thereof, the maximum travel time of the carriers can be decreased and therefore the response time of the photodiode can be increased by providing a well layer in an intermediate position (that is, in an intermediate position between the first light-absorbing sub-layer 313 and second light-absorbing sub-layer 317) between the light-absorbing layers of a photodiode of an end surface incidence type.

However, since the amount of light incident upon each light-absorbing layer becomes half of that in the conventional photodiode with a monolayer configuration, the sensitivity (photocurrent) is halved. Similarly, a light-absorbing layer can be divided in n (here, n is integer of no less than 3) regions with a thickness of each layer of d/n and the well layers similar to the above-described one can be formed between the light-absorbing sub-layers. In this case, the maximum travel time $\tau_{tr}$ of carriers can be reduced as 1/n. Furthermore, the band width obtained when the total thickness d of the light-absorbing sub-layers is optimized is increased by a factor of $n^{1/2}$ with respect to that of the conventional monolayer pin-type photodiode in which the thickness of the light-absorbing sub-layer is d. Therefore, even greater increase in the operation rate can be expected. In this case, too, the amount of light incident upon each light-absorbing sub-layer becomes 1/n of that of the conventional monolayer photodiode and the sensitivity (photocurrent) is reduced as 1/n. However, the aforesaid decrease in sensitivity caused by the division of the light-absorbing layer can be fully compensated by providing an amplifier at the next stage, and no problem is associated with operation.

Figure 5:
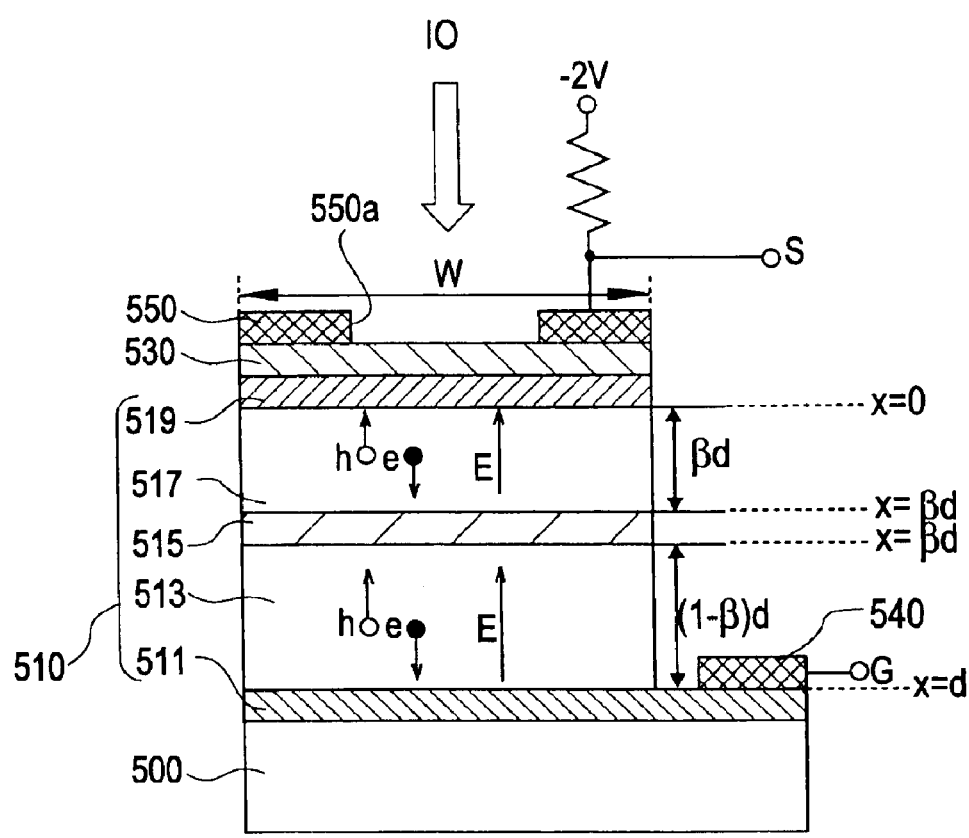
FIG. 5 is a cross-sectional view illustrating a schematic structure of a photodiode of an upper surface incidence type having a pin-type configuration in accordance with the second embodiment of the second aspect of the present invention.

The second embodiment of the present invention according to the second aspect thereof will be described hereinbelow. FIG. 5 is a cross-sectional view schematically illustrating the structure of a photodiode which is a photodetector device of the second embodiment of the present invention according to the second aspect thereof. The photodiode of the second embodiment is a photodiode of an upper surface incidence type in which the incident light I0 is received from the upper surface side and which has a pin-type structure.

In FIG. 5, the reference numeral 500 stands for an semiinsulating substrate composed of InP having semiinsulating properties. The reference numeral 510 stands for a photodiode unit former on substrate 500. The photodiode unit 510 has a structure obtained by successive lamination of an n-type blocking layer 511, a first light-absorbing sub-layer (this light-absorbing sub-layer is also referred to as an i-type layer or intrinsic semiconductor layer hereinbelow) 513, a well layer 515, a second light-absorbing sub-layer (this light-absorbing sub-layer is also referred to as an i-type layer or intrinsic semiconductor layer hereinbelow) 517, and a p-type blocking layer 519. The n-type blocking layer 511 is formed of $n^+$-type InP for preventing the injection of positive holes from the outside and a thickness thereof is within a range of 0.5~1 $\mu$m. The first light-absorbing sub-layer 513 is formed of non-doped (i-type) $In_{0.53}Ga_{0.47}As$ for absorption of light and generation of electron-hole pairs. The well layer 515 is formed of non-doped (i-type) $In_xGa_{1-x}As$ (where x>0.53; for example, x=0.70) so as to have a small thickness and a band gap less than that of the first light-absorbing sub-layer ($In_{0.53}Ga_{0.47}As$). The second light-absorbing sub-layer 517 is formed of non-doped (i-type) $In_{0.53}Ga_{0.47}As$ for absorption of light and generation of electron-hole pairs so as to have the same composition as the first light-absorbing sub-layer 513. The p-type blocking layer 519 is formed of $p^+$-type InP for preventing the injection of electrons from the outside and has a thickness within a range of 0.5~1 $\mu$m.

The reference numeral 530 stands for a $p^{++}$-type $In_{0.53}Ga_{0.47}As$ contact layer (thickness about 0.1 $\mu$m) for ohmic contact with the electrode formed on the p-type blocking layer 519. The reference numeral 540 stands for a first electrode electrically connected to the n-type blocking layer 511 and formed by successive lamination of a gold-germanium alloy (AuGe), nickel (Ni), and gold (Au) (that is, a AuGe/Ni/Au laminated configuration) on the end portion of the n-type blocking layer 511. The reference numeral 550 stands for a second electrode electrically connected to the contact layer 530 and formed by successive lamination of titanium (Ti), platinum (Pt), and gold (Au) (that is, a Ti/Pt/Au laminated configuration) on the contact layer 530. An opening 550a is provided in the second electrode 550 correspondingly to the region in which the signal light incident from the upper surface is received. The reference character S stands for an output signal terminal, G for a ground terminal, and V for a power source terminal.

When such photodiode is driven, a voltage of about −3~−5 V (volts) is applied to the power source terminal V and the ground terminal G is grounded. Furthermore, characters h, e, and E stand for holes, electrons, and electric field, respectively, W stands for a width of the photodetector element unit.

The above-described layers were formed so as to provide for lattice matching between the substrate 500 and n-type blocking layer ($n^+$-type InP) 511, between the n-type blocking layer ($n^+$-type InP) 511 and first light-absorbing sub-layer 513, between the second light-absorbing sub-layer 517 and p-type blocking layer 519 ($p^+$-type InP), and between the p-type blocking layer 519 ($p^+$-type InP) and contact layer 530.

The well layer (i-type $In_xGa_{1-x}As$) 515, as described above, is provided between the first light-absorbing sub-layer 513 and second light-absorbing sub-layer 517 and serves to form a band valley (energy well) in both the conduction band and the valence band. The well layer 515 has an In content ratio higher than that in the first and second light-absorbing sub-layers 513, 517 and the configuration thereof is such that the band gap with the light-absorbing sub-layers is decreased. If the thickness of the well layer 515 is increased, the amount of absorbed light is increased. Therefore, it is preferred that the thickness of the well layer may be no more than 100 nm. On the other hand, if the thickness thereof is too small, the probability of carriers passing though the well layer without recombination is increased. Therefore, it is preferred that the thickness of the well layer may be no less than 5 nm.

The composition of layers, laminated structure, and process for the fabrication of the photodiode of the present embodiment are basically identical to those of the above-described photodiode of the first embodiment of the second aspect of the present invention.

The important difference between the photodiode of the second embodiment of the present invention according to the second aspect thereof and the photodiode of the above-described first embodiment of the present invention according to the second aspect thereof is in that the photodiode of the second embodiment of the present invention according to the second aspect thereof is of an upper surface incidence type, the first and second light-absorbing sub-layers 513, 517 have different thickness because the amount of absorbed light is not uniform in the longitudinal direction, and the width W of the element unit is made greater than that of the photodiode of the first embodiment to increase the light receiving surface because the photodiode is of an upper surface incidence type.

This photodiode is of an upper surface incidence type and, as mentioned above, the amount of absorbed light is not uniform in the longitudinal direction. Therefore, the speed of operation is increased by making the first and second light-absorbing sub-layers 513, 517 of different thickness. More specifically the thickness of the first light-absorbing sub-layer 513 is $(1-\beta)d$, and the thickness of the second light-absorbing sub-layer 517 is $\beta d$. Here, a factor $\beta$ is set within a range $0<\beta<0.5$, and d is the thickness, d=0.4~1.0 $\mu$m of the light-absorbing layer of the conventional monolayer photodiode of an upper surface incidence type.

The increase in the operation speed attained by setting the thickness of the first and second light-absorbing sub-layers 513, 517 as indicated above will be described below. The following equations (1), (2a), (2b), (3a), (3b), (4a), (4b), (5a), (5b), (5c), (6a), (6b), (6c), (7a), (7b), (8a), and (8b) employed for the explanation of the present embodiment are identical to equations (1), (2a), (2b), (3a), (3b), (4a), (4b), (5a), (5b), (5c), (6a), (6b), (6c), (7a), (7b), (8a), and (8b) employed in the explanation of the first embodiment of the first aspect of the present invention. For this reason, they were assigned with the same numbers.

Here, x will denote the distance from the interface between the second light-absorbing sub-layer 517 and the p-type blocking layer 519 (this interface will be a reference point x=0) to the interface between the n-type blocking layer 511 and first light-absorbing sub-layer 513. In this case, the interlayer (more specifically, the well layer 515 sandwiched between the first and second light-absorbing sub-layers 513, 517) absorbs the light. However, since the thickness of the interlayer is small by comparison to that of the light-absorbing sub-layers, the interlayer can be ignored and not taken into account in the distance x.

If the signal light is received from the upper part (x=0) in the course of driving, the photocarrier generation rate G(x) in the first and second light-absorbing sub-layers can be represented by the following formula (1).

$$G(x)=G_0(1-R)\alpha\exp(-\alpha x) \quad (1)$$

wherein $G_0$ stands for a photon density in the incident light, R is a reflection factor, and $\alpha$ is the light absorption coefficient of the light-absorbing sub-layers with respect to the incident light.

The electron current density, $J_n(x)$, and hole current density, $J_p(x)$, in the light-absorbing layer can be represented by the following formulas (2a), (2b).

$$J_n(x)=qv_n n(x) \quad (2a)$$

$$J_p(x)=qv_p p(x) \quad (2b)$$

where q stands for an elementary charge, $v_n$ and $v_p$ stand for a speed of electrons and holes, respectively, n(x) stands for an electron density per unit volume (1 cm³) in the light-absorbing layer in a position at a distance of x, and p(x) stands for a hole density per unit volume (1 cm³) in the light-absorbing layer in a position at a distance of x.

Carrier continuity equations are represented by the following formulas (3a), (3b).

$$(dn(x)/dt)=G(x)+(1/q)div J_n(x) \quad (3a)$$

$$(dp(x)/dt)=G(x)-(1/q)div J_p(x) \quad (3b)$$

Therefore, if the electron current density $J_n(x)$ and hole current density $J_p(x)$ represented by the above-described formulas (2a), (2b) are substituted into the formulas (3a), (3b) above, the following formulas (4a), (4b) can be obtained in a stationary state.

$$(dn(x)/dt)=G(x)-(d(v_n n(x))/dx)=0 \quad (4a)$$

$$(dp(x)/dt)=G(x)+(d(v_p p(x))/dx)=0 \quad (4b)$$

Here, $J_{n1}(x)$ stands for electron current density and $J_{p1}(x)$ stands for a hole current density in the first light-absorbing sub-layer 513, and $J_{n2}(x)$ stands for electron current density and $J_{p2}(x)$ stands for a hole current density in the second light-absorbing sub-layer 517. Now, suppose that $J_{n2}(0)=0$, $J_{p2}(\beta d)=0$ when $0 \leq x \leq \beta d$ (second light-absorbing sub-layer 517) and also suppose that $J_{n1}(\beta d)=0$, $J_{p1}(d)=0$ when $\beta d \leq x \leq d$ (first light-absorbing sub-layer 513) as boundary conditions, where a thickness of the second light-absorbing sub-layer 517 which is the upper layer is denoted by $\beta d$ ($0<\beta<0.5$) and the thickness of the first light-absorbing sub-layer 513 which is the lower layer is denoted by $(1-\beta)d$, then in the range $0 \leq x \leq \beta d$, $$J_{n2}(x)=qG_0(1-R)(1-\exp(-\alpha x)) \quad (5a)$$

$$J_{p2}(x)=-qG_0(1-R)(\exp(-\alpha\beta d)-\exp(-\alpha x)) \quad (5b)$$

$$J_2(x)=J_{n2}(x)+J_{p2}(x)=qG_0(1-R)(1-\exp(-\alpha\beta d)) \quad (5c)$$

where $J_2(x)$ is the total current density in the second light-absorbing sub-layer 517.

Furthermore, in the range of $\beta d \leq x \leq d$, $$J_{n1}(x)=qG_0(1-R)(\exp(-\alpha\beta d)-\exp(-\alpha x)) \quad (6a)$$

$$J_{p1}(x)=-qG_0(1-R)(\exp(-\alpha d)-\exp(-\alpha x)) \quad (6b)$$

$$J_1(x)=J_{n1}(x)+Jp1(x)=qG_0(1-R)(\exp(-\alpha\beta d)-\exp(-\alpha d)) \quad (6c)$$

where $J_1(x)$ is the total current density in the first light-absorbing sub-layer 513.

Therefore, in the intermediate well layer 515, the following condition should be satisfied for a complete recombination of the carriers:

$J_{n2}(\beta d)=J_{p1}(\beta d)$, that is $$1-\exp(-\alpha\beta d)=\exp(-\alpha\beta d)-\exp(-\alpha d) \quad (7a)$$

Therefore, $\beta$ can be expressed as $$\beta=\ln\{2/(1+\exp(-\alpha d))\}/(\alpha d) \quad (7b)$$

If $\tau_{trp}$ denotes the maximum travel time of the carrier in the first and second light-absorbing sub-layers 513, 517 in case of electrons and $\tau_{trp}$ in case of holes, then the following equations will be valid:

$$\tau_{trn2}=\beta d/v_n, \tau_{trp2}=\beta d/v_p \quad (8a)$$

$$\tau_{trn1}=(1-\beta)d/v_n, \tau_{trp1}=(1-\beta)d/v_p \quad (8b)$$

Here, index 1 relates to the first light-absorbing sub-layer 513 and index 2 relates to the second light-absorbing sub-layer 517.

Since $v_n > v_p$ in the i-type InGaAs, the following condition is satisfied: $\tau_{trp1} > \tau_{trn1}$, $\tau_{trp2} > \tau_{trn2}$.

Furthermore, since $0<\beta<0.5$, the following condition is satisfied: $\tau_{trp1} > \tau_{trp2}$.

Therefore, the maximum travel time of the carriers in the present element is $\tau_{trp1}=(1-\beta)d/v_p$.

The maximum travel time of the carriers is $\tau_{trp}=d/v_p$ when no intermediate well layer 515 is present, that is, in case of the above-described conventional monolayer photodiode of an upper surface incidence type. By contrast, in the photodiode of the second embodiment, the insertion of the intermediate well layer 515 shortens the conventional maximum travel time of the carriers by a factor of $(1-\beta)$. Therefore, the photodiode of the present embodiment can operate at a rate faster than that of the above-described conventional monolayer photodiode of an upper surface incidence type. Thus, a photodiode can be realized which has a response speed allowing for effective operation even with respect to a signal light modulated with a high modulation frequency of no less than 20 Gb/s that was not suitable for the conventional pin-type photodiodes of an upper surface incidence type that had a monolayer configuration.

The energy gap during the operation of the photodiode of the present embodiment is identical to that shown in FIG. 4 relating to the above-described first embodiment of the second invention. The description thereof is omitted (the incidence position of the incident light I0 is from the side of the contact layer 330 in FIG. 4).

The second aspect of the present invention is not limited to the above-described embodiments and various modification can be incorporated according to the design.

For example, in the above-described embodiments, a pin-type photodiode of an InP/InGaAs system for high-speed optical communications was considered, but the structure of this photodiode is not limited to a p⁺-type InP layer (p-type blocking layer)/i-type $In_{0.53}Ga_{0.47}As$ layer (second light-absorbing sub-layer)/i-type $In_xGa_{1-x}As$ (x>0.53) (well layer)/i-type $In_{0.53}Ga_{0.47}As$ (first light-absorbing sub-layer)/ n⁺-type InP layer (n-type blocking layer) laminated configuration. For example, an InGaAsP layer may be introduced as an optical waveguide layer between the p⁺-type InP layer (p-type blocking layer) and i-type $In_{0.53}Ga_{0.47}As$ layer (second light-absorbing sub-layer) and between the n⁺-type InP layer (n-type blocking layer) and i-type $In_{0.53}Ga_{0.47}As$ (first light-absorbing sub-layer), this InGaAsP layer having a band gap between the band gaps of those layers. Thus, the same effect can be expected with a p⁺-type InP layer (p-type blocking layer)/p-type InGaAsP layer (p-type optical waveguide layer)/i-type In$_{0.53}$Ga$_{0.47}$As layer (second light-absorbing sub-layer)/i-type In$_x$Ga$_{1-x}$As (x>0.53) (well layer)/i-type In$_{0.53}$Ga$_{0.47}$As (first light-absorbing sub-layer) n-type InGaAsP layer (n-type optical waveguide layer)/n⁺-type InP layer (n-type blocking layer) laminated configuration.

Figure 9:
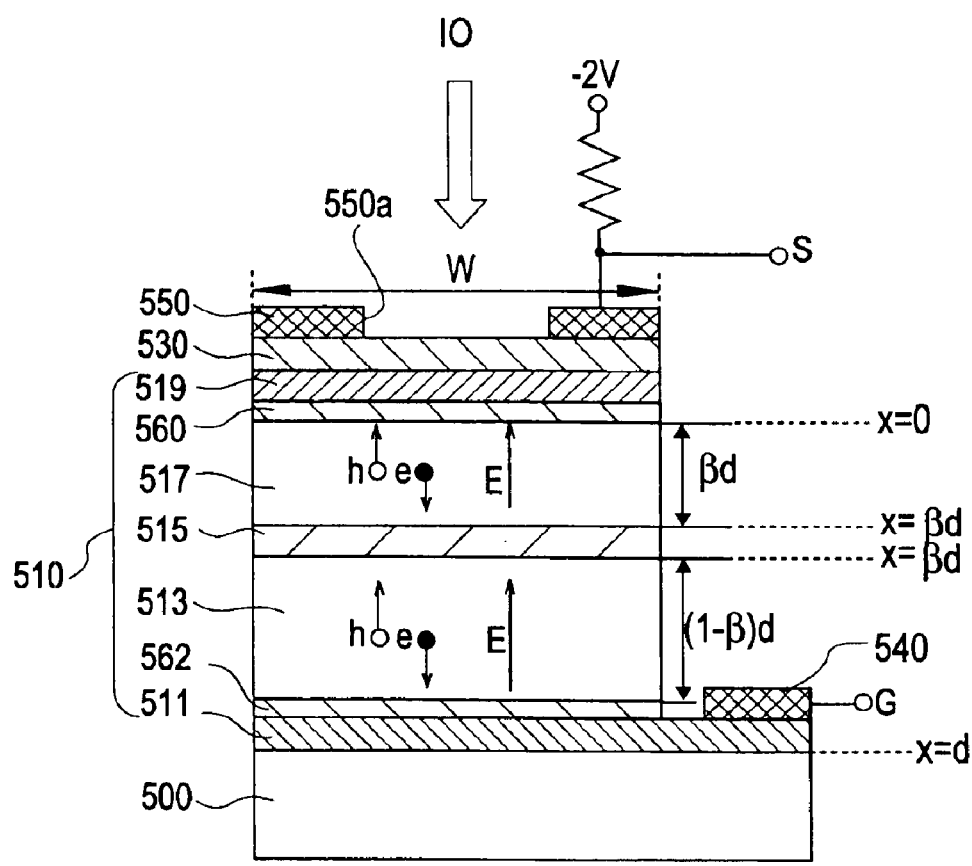
FIG. 9 is a cross-sectional view illustrating a schematic modified structure of that shown in FIG. 5.
Figure 10:
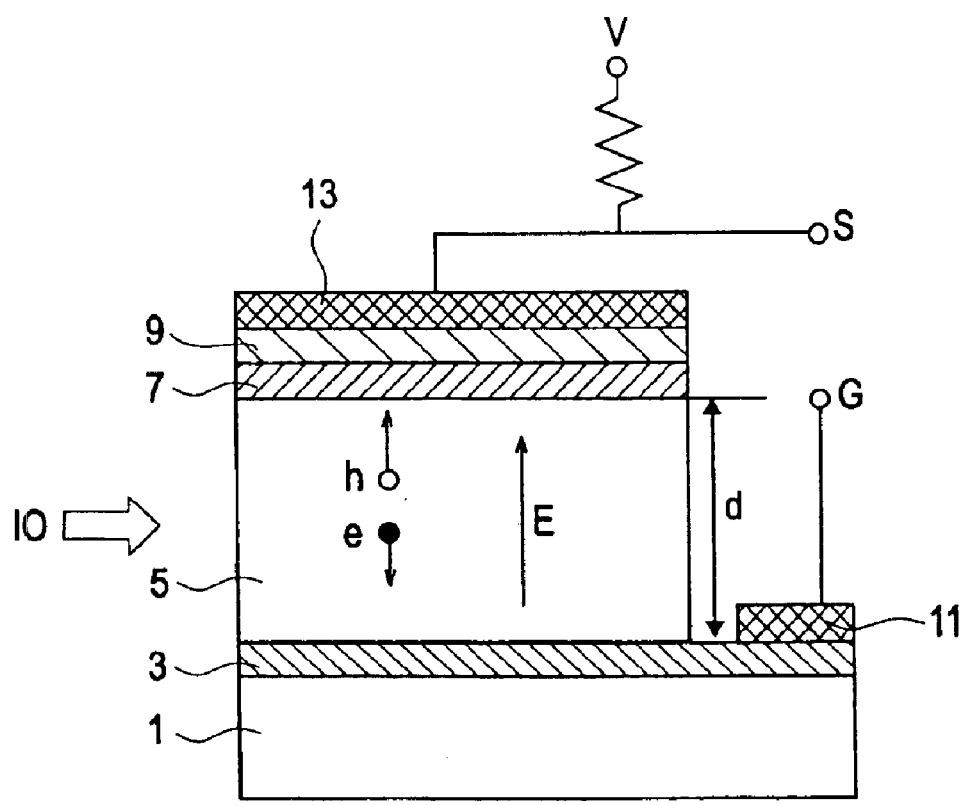
FIG. 10 is a cross-sectional view illustrating a schematic structure of a conventional photodiode of an end surface incidence type having a pin-type configuration.
Figure 11:
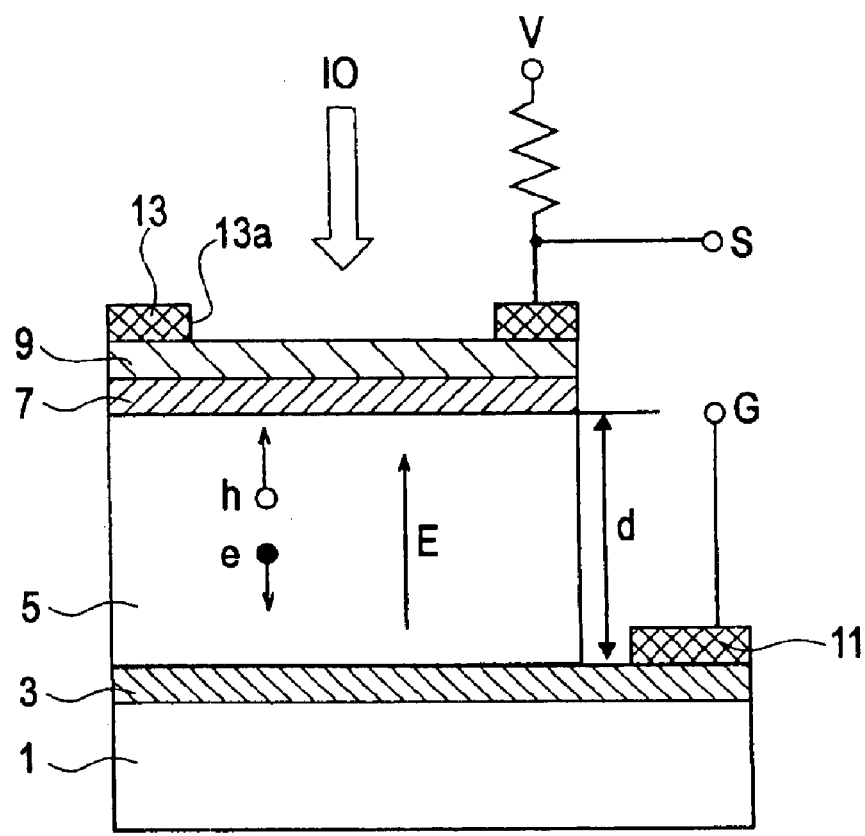
FIG. 11 is a cross-sectional view illustrating a schematic structure of a conventional photodiode of an upper surface incidence type having a pin-type configuration.

FIGS. 8 and 9 show modified examples of the structure shown in FIGS. 3 and 5, respectively. In FIG. 8, the first conductivity type (for example, p-type) optical waveguide layer is shown by 360 and the second conductivity type (for example, n-type) optical waveguide layer is shown by 362. In FIG. 9, the first conductivity type optical waveguide layer is shown by 560 and the second conductivity type optical waveguide layer is shown by 562.

Moreover, various modifications can be considered as oter epitaxial structures. Furthermore, the same effect can be also expected from a nip-type photodiode having a structure inverted with respect to the pin-type structure.

The materials constituting the photodiode of the second aspect of the present invention are not limited to the above-described materials, and the same effect can be expected from pin-type photodiodes using other materials, for example, GaAs, AlGaAs, Si, and Ge.

What is claimed is:

1. A photodetector device comprising:
   a structure in which a plurality of photodetector element units are stacked,
   wherein each of said photodetector element units is formed by sequential lamination of a first blocking layer of a first conductivity type semiconductor, a light-absorbing layer of an intrinsic semiconductor, and a second blocking layer of a second conductivity type semiconductor, on a substrate,
   wherein a first modulated signal light incident on the photodetector device is absorbed by each of said light-absorbing layers and converted into an electric signal provided as an output of the photodetector device, and
   wherein the photodetector device is of an end surface incidence type, in which said first modulated signal light is incident upon an end surface of each of the light-absorbing layers of said photodetector element units, and the light-absorbing layers in said photodetector element units have substantially identical thicknesses.

2. The photodetector device according to claim 1, wherein said first blocking layer is formed of first conductivity type InP, said light-absorbing layer is formed of an i-type In$_1$Ga$_{1-y}$As (where y is a positive real number, and 1>y>0), and said second blocking layer is formed of second conductivity type InP.

3. The photodetector device according to claim 1, wherein each of said photodetector element units comprises a first optical waveguide layer of the first conductivity type semiconductor and a second optical waveguide layer of the second conductivity type semiconductor, said first optical waveguide layer is provided between said first blocking layer and said light-absorbing layer and has a band gap intermediate between those of said first blocking layer and said light-absorbing layer, and said second optical waveguide layer is provided between said light-absorbing layer and said second blocking layer and has a band gap intermediate between those of said light-absorbing layer and said second blocking layer.

4. The photodetector device according to claim 3, wherein said first blocking layer is formed of first conductivity type InP, said light-absorbing layer is formed of i-type In$_y$Ga$_{1-y}$As (where y is a positive real number, and 1>y>0), said second blocking layer is formed of second conductivity type InP, said first optical waveguide layer Is formed of first conductivity type InGaAsP, and said second optical waveguide layer is formed of second conductivity type InGaAsP.

5. The photodetector device according to claim 1, wherein said first conductivity type is one of n-type and p-type, and said second conductivity type is an other one of n-type and p-type.

6. The photodetector device according to claim 1, wherein said photodetector element units are laminated in two layers and the thickness of each of said light-absorbing layers is 0.2~0.5 μm.

7. A photodetector device comprising a photodetector element unit which is formed by sequential lamination of a first blocking layer of a first conductivity type semiconductor, a light-absorbing layer of an intrinsic semiconductor, and a second blocking layer of a second conductivity type semiconductor, on a substrate,
   wherein a plurality of light-absorbing sub-layers are provided as said light-absorbing layer, and a well layer having a band gap less than that of said light-absorbing sub-layers and forming an energy well in both a conductivity band and a valence band is provided between said light-absorbing sub-layers, and
   wherein the photodetector device is of an upper surface incidence type in which a signal light is incident on an upper surface of the second blocking layer, the light-absorbing sub-layers have different thicknesses, and the thickness of the light-absorbing sub-layer of the photodetector element unit which is closer to the second blocking layer is less than the thickness of the light-absorbing sub-layer which is farther from the second blocking layer,
   the photodetector device further comprising a first optical waveguide layer of the first conductivity type semiconductor provided between said first blocking layer and a first light-absorbing sub-layer adjacent thereto, and a second optical waveguide layer of the second conductivity type semiconductor provided between said second blocking layer and a second light-absorbing sub-layer adjacent thereto, wherein said first optical waveguide layer has a band gap intermediate between those of said first blocking layer and said first light-absorbing sub-layer, and said second optical waveguide layer has a band gap intermediate between those of said second blocking layer and said second light-absorbing sub-layer.

8. The photodetector device according to claim 7, wherein said first blocking layer is formed of first conductivity type InP, said light-absorbing sub-layers are formed of i-type In$_y$Ga$_{1-y}$As (where y is a positive real number, and 1>y>0), said well layer is formed of i-type In$_x$Ga$_{1-x}$As (where x is a positive real number, and 1>x>y), and said second blocking layer is formed of second conductivity type InP.

9. The photodetector device according to claim 7, wherein said first blocking layer is formed of first conductivity type InP, said light-absorbing sub-layers are formed of i-type In$_y$Ga$_{1-y}$As (where y is a positive real number, and 1>y>0), said well layer is farmed of i-type In$_x$Ga$_{1-x}$As (where x is a positive real number, and 1>x>y), said second blocking layer is formed of second conductivity type InP, said first optical waveguide layer is formed of first conductivity type InGaAsP, and said second optical waveguide layer is formed of second conductivity type InGaAsP.

10. The photodetector device according to claim 7, wherein said first conductivity type is any one of n-type and p-type, and said second conductivity type is an other one of n-type and p-type.

11. The photodetector device according to claim 7, wherein a combined thickness of said first light-absorbing sub-layer and said second light-absorbing sub-layer is 0.4~1.0 $\mu$m.

* * * * *